April 16, 1968 B. B. BEEKEN 3,378,023

FLUID AMPLIFIER

Filed April 1, 1965 2 Sheets-Sheet 1

INVENTOR.
Basil B. Beeken
BY
Albert W. Scribner
ATTORNEY

April 16, 1968 B. B. BEEKEN 3,378,023

FLUID AMPLIFIER

Filed April 1, 1965 2 Sheets-Sheet 2

INVENTOR.
Basil B. Beeken
BY
Albert W. Scribner
ATTORNEY

United States Patent Office 3,378,023
Patented Apr. 16, 1968

3,378,023

FLUID AMPLIFIER

Basil B. Beeken, New Haven, Conn., assignor to Pitney-Bowes, Inc., Stamford, Conn., a corporation of Delaware Filed Apr. 1, 1965, Ser. No. 444,738
3 Claims. (Cl. 137—81.5)

ABSTRACT OF THE DISCLOSURE

This invention relates to improving the efficiency or power recovery factor for fluid amplifiers. Here at least a portion of the side walls of the interaction chamber of a wall attachment type fluid amplifier are formed to a substantially circular convex configuration, this convex shape having a radius of curvature equal to between 4 and 6 times the width of the amplifier throat passage and having a center of curvature located along a line passing laterally through said amplifier throat, the arc subtended by said convex side wall portion being between 25 and 35 degrees.

This invention relates to an improved bistable fluid amplifier. More particularly the invention relates to an improved fluid amplifier having a novel construction and arrangement which produces signifiant improvements in the operational efficiency and switching speeds of the amplifier.

In practical use fluid amplifiers are incorporated in control and/or power circuits and when so used have operational loads imposed on the output line or lines thereof. It is therefore important that the operational efficiency of these fluid amplifiers be as high as possible especially in applications where large numbers of amplifiers are used or where large quantities of fluid are used in the operation of a given circuit. For a given set of operating conditions any improvement in the efficiency of a fluid amplifier can result in a very significant decrease in the amount of fluid consumed, the fluid supply pressures required and/or the size of the pumping means needed to supply fluid to the amplifier system.

The operational efficiency of a fluid amplifier may be defined as the ratio of the power available at an operating output line divided by the then existing power input to the amplifier. It is apparent here that increasing the available output power is the way to increase amplifier efficiency and the instant invention is directed primarily to this aspect of amplifier operation. The amount of power output available from a fluid amplifier is largely governed by a so-called pressure recovery factor which is a measure of the degree of possible loading of an amplifier. The pressure recovery factor may be defined as the ratio of the maximum possible fluid impact pressure that can be developed by the fluid stream in an amplifier output line divided by the then existing fluid supply pressure to the amplifier input line. Conventional type fluid amplifiers have pressure recovery factors in the neighborhood of 25 to 30 percent whereas a fluid amplifier constructed and arranged in accordance with the instant invention can have a pressure recovery factor of almost double this value whereby the efficiency of the amplifier may be increased by a factor of nearly 2. This very significant operational improvement is here obtained by interrelating the shape and relative location of certain surfaces of the fluid conducting passages as will be described in detail below. As an incidence to the use of the instant novel amplifier configuration higher switching speeds are obtained.

The principal object of the instant invention is to provide an improved fluid amplifier construction which affords a marked improvement in the amplifier operational efficiency.

Another object of the invention is to provide an improved fluid amplifier which, in addition to the above noted improved operative characteristics, is relatively simple and inexpensive to manufacture and is reliable in operation.

Another object of the instant invention is to provide an improved fluid amplifier which will operate reliably over a wide range of fluid supply pressures.

A further object of the invention is to provide an improved fluid amplifier having an interaction chamber whose side walls are each effectively defined by a smooth continuous arc extending from one side of the amplifier throat to the side wall of the associated outlet channel.

Other objects will become apparent as the disclosure progresses.

The instant fluid amplifier may be manufactured by any suitable technique however for low cost accurate production an etching type process is preferred. In this type of process the desired configuration for the fluid conducting passages of the amplifier are etched in the face of a main plate member by known chemical and/or photographic techniques, this face of the plate member then being sealingly covered by a cover plate member so that the sandwiched composite unit then possesses the desired substantially rectangularly cross-sectional fluid conducting channels therethrough. This type of fabricating technique is well known and hence will not be further particularized here. The structural novelty of the instant invention involves the contouring and relative positioning of several of the critical operative surfaces of a fluid amplifier and the instant FIG. 2 illustrates the nature of this particular configuration and arrangement and how it is developed.

Figure 1:
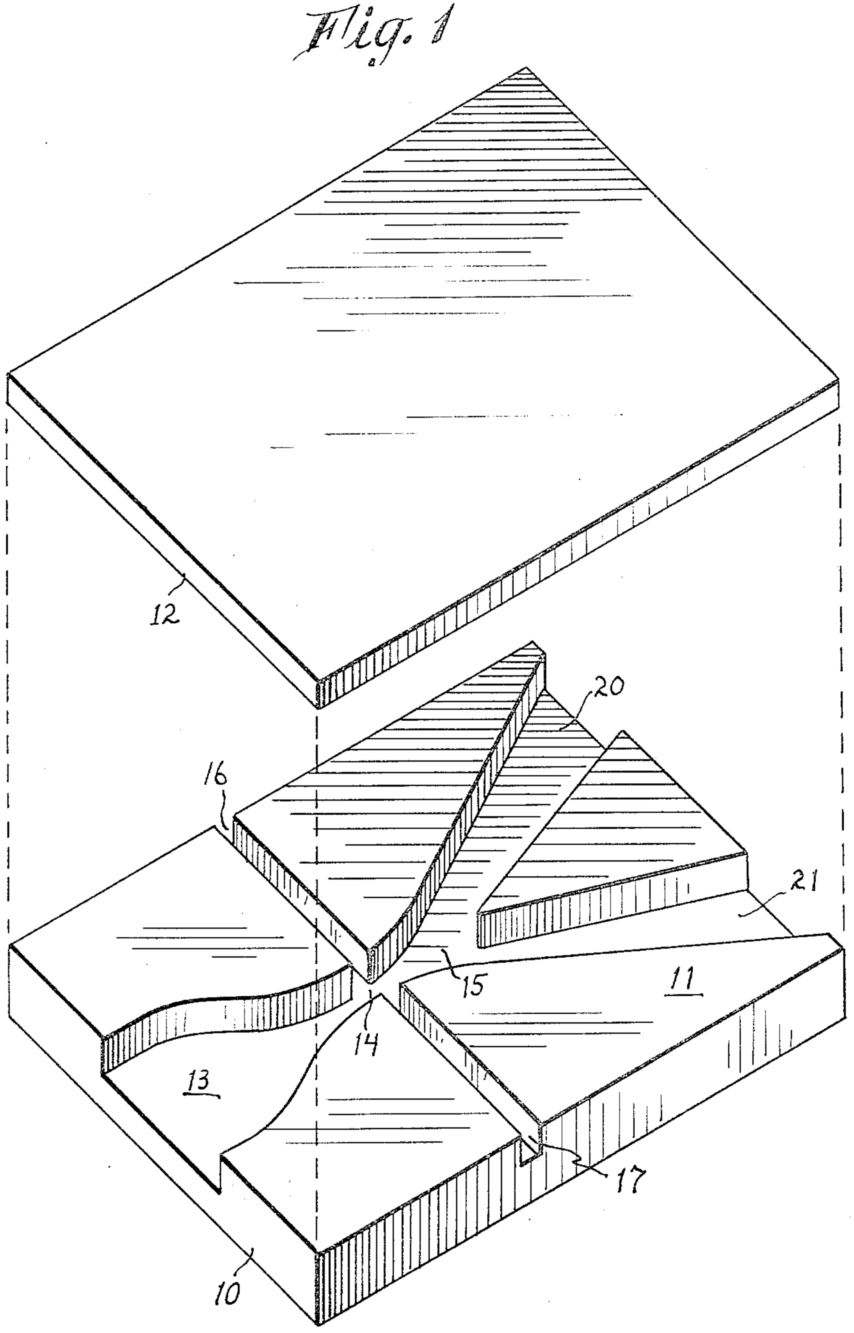
FIG. 1 is an exploded perspective view illustrating the overall construction of the instant fluid amplifier.

FIG. 1 shows the general laminar type construction for the instant amplifier. The main plate 10 has an upper face 11 that is etched or otherwise formed so as to define the various desired fluid conducting grooves therein. The said upper face 11 is covered with a plate 12 which is sealingly secured to the main plate 10 by any suitable means, such as an adhesive, so as to thereby close the upper edges of said grooves whereby the fluid conducting passages of the amplifier become generally rectangular in cross section. As illustrated in FIG. 1 the fluid conducting passages include a main supply input channel 13 which, through a throat 14 and an interaction chamber 15, communicates with a pair of divergent outlet channels 20 and 21. A pair of opposed control channels 16 and 17 respectively communicate with an upstream portion of said chamber 15. In operation fluid flows from the inlet channel 13 through throat 14 into the interaction chamber 15 and then out through either of the outlet channels 20 or 21 depending on the then operative state of the amplifier. This general type of construction and operation is well known in the art and need not be further discussed here.

Figure 2:
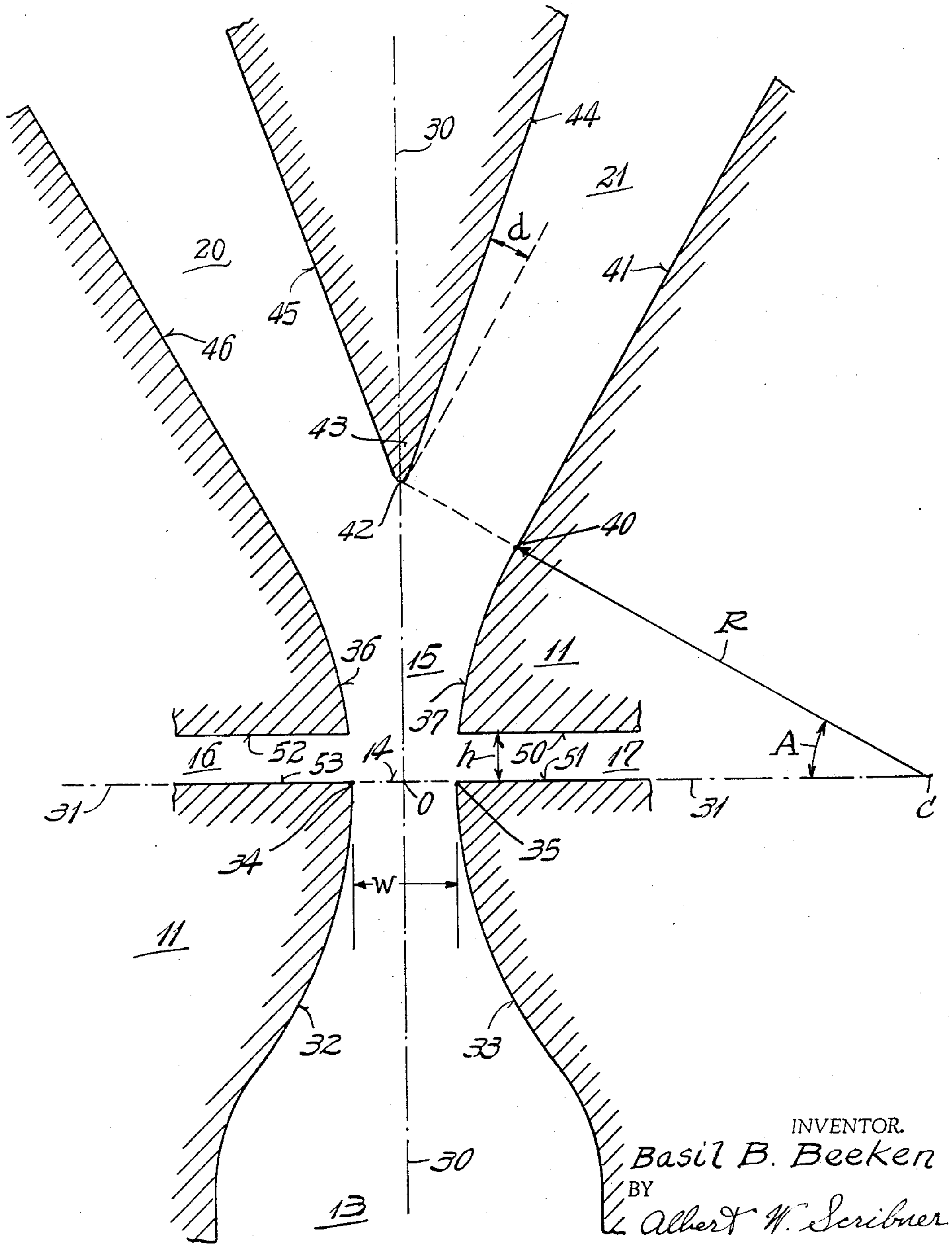
FIG. 2 is a plan view showing the profile of the fluid conducting passages of the instant amplifier wherein a particular geometric relationship exists between certain elemental parts and/or surfaces of the device.

Referring to FIG. 2 there is shown in detail the novel configuration for the plan profile of the critical channel surfaces of the instant amplifier and the geometric characteristics of this profile will become apparent from the following description of how this profile is generated. Unless otherwise stated it may be assumed that the various fluid conducting grooves or channels of the main plate, as illustrated in FIG. 2, have cross sectional shapes that are generally rectangular in nature, i.e. have substantially parallel vertical side walls and substantially horizontal flat bottom surfaces; all of said channels having substantially the same vertical depth. It may also be assumed that the center line 30 constitutes an axis of symmetry for the contouring and the arrangement of the various hereinafter discussed fluid conducting passages of the instant amplifier. The cover plate 12 has been removed in FIG. 2 for the purpose of clarity in the description of the geometry of the amplifier channel configuration.

In general the instant invention contemplates the provision of continuous convex arcuate side wall surfaces for the interaction chamber of the amplifier, these surfaces respectively blending smoothly at either end thereof with the side walls defining the throat and the outlet channels of the amplifier. These smooth convex side wall surfaces of the interaction chamber are interrupted only by the amplifier control ports, the edges of said ports being location right on said convex side wall surfaces, there being no so-called set back. The shape of each arcuate convex side wall surface of the interaction chamber is effectively defined by a conic section curve which may, for practical purposes, be very closely approximated by a circular arc as will be more fully discussed below.

Considering now a detailed geometric analysis of the side walls of the interaction chamber 15, a base line 31 is initially constructed so as to be perpendicular to the said center line 30, the base line 31 intersecting the center line 30 at a point 0. The side walls 32 and 33 of the main inlet channel 13 generally converge towards each other as shown and intersect the base line 31 at points 34 and 35 respectively, that portion of base line 31 extending between the points 34 and 35 defining the narrowest lateral dimension or width *w* of the amplifier throat 14. The dimension *w* is initially selected in accordance with the effective size of the amplifier desired, and the other hereinafter described critical dimensions are derived from this selected value for the throat width *w*. The said width *w* is preferably less than the depth of the amplifier throat, the depth being measured in a direction normal to the plane of FIG. 2. Once the dimension *w* is selected the points 34 and 35 are thereby fixed and the side walls 32 and 33 are then arranged and shaped so as to gradually converge to said points 34 and 35. The bell-shaped convergent configuration shown for the side walls 32 and 33 is not particularly critical and may have most any generally tapered shape that gradually narrows to the throat width *w* and maintains good streamline flow in the fluid passing from the inlet channel 13 into and through the throat 14. The contour and position of the interaction chamber side walls 36 and 37 located downstream from the throat 14 are critical and are geometrically developed as follows. A point C is located on the base line 31 such that its distance from point 0 is between 4 and 6 times the width *w* of the throat 14. Using point C as a center a circular arc is swung from point 35 to a point 40, this circular arc thereby defining the arcuate contour of side wall 37. The circular arc 35, 40 subtends an angle A of between 25 and 35 degrees. The preferable length for the radius of curvature R of the arc 35, 40 is approximately 5 times the width *w*, while the preferable value for the angle A is approximately 30 degrees. The outer side wall 41 defining a portion of the outlet channel 21 extends in a substantially straight line from point 40 so as to be substantially perpendicular to a line extending between points C and 40; thus the side wall 41 extends in a direction that is tangent to the circular arc 35, 40 at point 40. The throat side wall immediately upstream from point 35 is also substantially tangent to the convex circular side wall 37 at the point 35. This tangential relationship of the said throat side wall and outlet channel side wall 41 with respect to ends of the arcuate side wall 37 of the interaction chamber 15 facilitates a streamline fluid flow in the interaction chamber 15 and tends to reduce power losses experienced by the fluid flowing through the amplifier.

The extension of a line between points C and 40 intersects the center line 30 at a point 42, this latter point effectively locating the leading edge of a splitter 43. The other side wall 44 of the outlet channel 21 is arranged to extend in a substantially straight line from point 42 so as to diverge at an angle *d* with respect to the said straight side wall 41. The value of the diffuser angle *d* is between 5 and 10 degrees, with 7 degrees being a preferred angle size. As mentioned above the center line 30 is an axis of symmetry, thus when the contour and relative location for the said side walls 37, 41 and 44 are determined for any selected value of the throat width *w*, as above described, the contour and relative location for the corresponding side walls 36, 45 and 46 become likewise fixed and hence the geometric configuration for the interaction chamber 15 and the shape and location of the outlet channels 20 and 21 become fixed as viewed in FIG. 2.

The straight side wall 50 of the control channel 17 is disposed substantially parallel to the opposite straight side wall 51 thereof, said side wall 51 being coincident with the base line 31. The effective width *h* of the control channel 17 is not particularly critical and may have a value of approximately ½ of the width *w* of the throat 14. The side walls 52 and 53 of the control channel 16 are arranged in a manner corresponding to that just discussed in connection with side walls 50, 51.

The above described configuration for the interaction chamber 15 is a most critical aspect of the present invention, and because of the particular arcuate convex shape of the side walls 36 and 37, and the extent and location thereof relative to both the throat 14 and the outlet channels 20, 21 the efficiency of the amplifier has been found to be greatly improved. When during the operation of the instant amplifier fluid flows through the throat 14 and out through outlet channel 21 the fluid stream in moving through the throat 14 and into the interaction chamber 15 immediately experiences the presence of and attaches itself to convex side wall 37 and follows along said side wall 37 by reason of the well known Coanda effect. As the fluid thus passes through the amplifier the characteristics of flow thereof closely resemble those which might be expected from the performance of a curved diffuser. Corresponding flow conditions exist when the fluid is exhausting through the outlet channel 20. The control ports, as defined by the intersection of the respective side walls of channels 16 and 17 with the side walls 36 and 37 of the interaction chamber 15, are not "set back" as in the case of most conventional devices but rather here are coincident with or right on the surfaces of the said side walls 36 and 37 respectively.

Several fluid amplifiers of varying sizes have been constructed in accordance with the above described geometric pattern and pressure recovery factors as high as 50% or slightly higher have been attained from the smaller sizes of these devices. These latter devices exhibited switching speeds in the 500 microsecond range and were capable of reliably operating at fluid supply pressures of less than one pound per square inch. One of the large sized amplifiers was constructed with a throat width *w* of .060 inch and this device was found to have a pressure recovery factor of 52% and a switching speed of less than 1.5 milliseconds. Each of these amplifiers was capable of reliably operating over a wider pressure supply range than conventional devices and with the indicated large increases possible in the pressure recovery factor was far more efficient than said conventional devices. These operational characteristics afford very significant practical advantages; for example, a much smaller size and lower cost pressure pumping means can now be used to supply fluid to the instant type of amplifier and its associated circuit. Such factors make possible the practical and efficient use of the instant type of fluid amplifier in a much wider range of control and/or power circuits.

Since many changes could be made in the embodiment of the invention as particularly described and shown herein without departing from the scope of the invention, it is intended that this embodiment be considered as exemplary and that the invention not be limited except as warrented by the following claims.

What is claimed is:

1. In a fluid amplifier having an inlet channel, a throat, an interaction chamber and a pair of outlet channels, said interaction chamber being substantially symmetrical about a center line passing through said throat and said chamber; the improvement comprising at least one of the side walls of said interaction chamber having a configuration that is effectively defined by a convex substantially circular arc having a radius equal to between 4 and 6 times the width of said throat and having a center of curvature located at a point on a base line which passes laterally through said throat and which is substantially perpendicular to said center line, the said circular arc subtending a first angle of between 25 and 35 degrees;

the outer side wall of one of said outlet channels being disposed in substantially tangential relation with respect to the terminal portion of the associated convex side wall of said interaction chamber, and the opposed side wall defining at least an initial portion of the opposite side of said one outlet channel diverging at an angle of between 5 and 10 degrees with respect to said outer side wall;

means defining a control channel that communicates with said interaction chamber, at least a portion of the side walls of said control channel being substantially coincident with said base line; and a splitter operatively disposed at the downstream end of said interaction chamber, the leading edge of said splitter being effectively located by the intersection of an extension of the line defining one side of said first angle and the said center line of said interaction chamber.

2. Apparatus as defined by claim 1 wherein said first angle is equal to approximately 30 degrees, and wherein the said radius of said arc is equal to approximately 5 times the width of said throat.

3. Apparatus as defined by claim 2 wherein said angle of said diverging side wall of said one outlet channel is equal to approximately 7 degrees.

References Cited

UNITED STATES PATENTS

| | | | |
|---|---|---|---|
| 3,075,679 | 1/1963 | Wadey | 137—81.5 |
| 3,128,039 | 4/1964 | Norwood | 137—81.5 |
| 3,137,464 | 6/1964 | Horton | 137—81.5 |
| 3,273,377 | 9/1966 | Testermann | 73—23.1 |
| 3,280,837 | 10/1966 | Manion | 137—81.5 |
| 3,283,766 | 11/1966 | Horton | 137—81.5 |

OTHER REFERENCES

Warren, R. W., Wall Effect and Binary Devices, p. 11, Proceedings of the Fluid Amplification Symposium, October 1962 V.I. (p. 20 relied on).

M. CARY NELSON, *Primary Examiner.*

W. CLINE, *Assistant Examiner.*